(12) United States Patent
Liao

(10) Patent No.: US 10,957,735 B2
(45) Date of Patent: Mar. 23, 2021

(54) LED DISPLAY

(71) Applicant: ASTI GLOBAL INC., TAIWAN, Changhua County (TW)

(72) Inventor: Chien-Shou Liao, New Taipei (TW)

(73) Assignee: ASTI GLOBAL INC., TAIWAN, Changhua County (TW)

( * ) Notice: Subject to any disclaimer, the term of this patent is extended or adjusted under 35 U.S.C. 154(b) by 26 days.

(21) Appl. No.: 16/389,185

(22) Filed: Apr. 19, 2019

(65) Prior Publication Data
US 2020/0152692 A1    May 14, 2020

(30) Foreign Application Priority Data

Nov. 12, 2018    (TW) .................................. 107140066

(51) Int. Cl.
| | |
|---|---|
| *H01L 27/15* | (2006.01) |
| *H01L 33/62* | (2010.01) |
| *H01L 33/00* | (2010.01) |
| *H01L 33/06* | (2010.01) |
| *H01L 33/36* | (2010.01) |
| *H01L 33/32* | (2010.01) |

(52) U.S. Cl.
CPC .......... *H01L 27/153* (2013.01); *H01L 33/007* (2013.01); *H01L 33/06* (2013.01); *H01L 33/32* (2013.01); *H01L 33/36* (2013.01); *H01L 33/62* (2013.01)

(58) Field of Classification Search
CPC ..................................................... H01L 27/156
See application file for complete search history.

(56) References Cited

U.S. PATENT DOCUMENTS

| | | | |
|---|---|---|---|
| 2002/0088983 A1* | 7/2002 | Yamamoto | ............ H01L 25/167 257/99 |
| 2015/0357315 A1 | 12/2015 | Oraw | |
| 2018/0287027 A1 | 10/2018 | Chaji | |
| 2019/0393201 A1* | 12/2019 | Caplet | ............... H01L 21/67121 |

FOREIGN PATENT DOCUMENTS

TW        201735320 A      10/2017

* cited by examiner

*Primary Examiner* — Moazzam Hossain
*Assistant Examiner* — Stanetta D Isaac
(74) *Attorney, Agent, or Firm* — Li & Cai Intellectual Property (USA) Office

(57) ABSTRACT

An LED display includes a wafer-level substrate, a first adhesive layer, a plurality of first light-emitting assemblies, and a first conductive structure. The wafer-level substrate includes a plurality of control circuits, each of which has a conductive contact. The first adhesive layer is disposed on the wafer-level substrate. Each first light-emitting assembly includes a plurality of first LED structures disposed on the first adhesive layer. The first conductive structure is electrically connected between the corresponding first LED structure and the control circuit. Thereby, each first light-emitting assembly including a plurality of first LED structures and a wafer-level substrate having a plurality of control circuits can be connected to each other through a first adhesive layer.

10 Claims, 19 Drawing Sheets

LED DISPLAY

This application claims the benefit of priority to Taiwan Patent Application No. 107140066, filed on Nov. 12, 2018. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a display, and more particularly to an LED display.

BACKGROUND OF THE DISCLOSURE

Light-emitting diodes (LED) are widely used nowadays due to their excellent light quality and high luminous efficiency. Generally, a conventional display device adopts a combination of red, green, and blue light-emitting diode chips to form a full color light-emitting diode display device for a better color performance. The full-color light-emitting diode display device can respectively emit three colors of red, green and blue light through three kinds of red, green and blue light-emitting diode chips, so as to form a full-color light for displaying relevant information after the mixing of light. However, the LED display of the related art and manufacturing method thereof still have room for improvement.

SUMMARY OF THE DISCLOSURE

In response to the above-referenced technical inadequacies, the present disclosure provides an LED display.

In one aspect, the present disclosure provides an LED display including: a wafer-level substrate, a first adhesive layer, a plurality of first light-emitting assemblies, a barrier layer, and a first conductive structure. The wafer-level substrate includes a wafer, a plurality of control circuits built in the wafer, and a plurality of ground circuits built in the wafer; each of the control circuits has a conductive contact exposed outside the wafer, and each of the ground circuits has a ground contact exposed outside the wafer. The first adhesive layer is disposed on the wafer; each of the first light-emitting assemblies includes a plurality of first LED structures disposed on the first adhesive layer without contacting the wafer-level substrate, and each of the first LED structures has a first positive electrode and a first negative electrode. The barrier layer is formed on the wafer-level substrate and the plurality of first light-emitting assemblies. The first conductive structure includes a plurality of first positive conductive layers and a plurality of first negative conductive layers; each of the first positive conductive layers is electrically connected between the corresponding first positive electrode and the corresponding conductive contact, and each of the first negative conductive layers is electrically connected between the corresponding first negative electrode and the corresponding ground contact.

In one aspect, the present disclosure provides another LED display including: a wafer-level substrate, a first adhesive layer, a plurality of first light-emitting assemblies, and a first conductive structure. The wafer-level substrate includes a plurality of control circuits, and each of the control circuits has a conductive contact. The first adhesive layer is disposed on the wafer-level substrate. Each of the first light-emitting assemblies includes a plurality of first LED structures disposed on the first adhesive layer. The first conductive structure is electrically connected between the first LED structure and the control circuit corresponding to each other.

Therefore, one of the beneficial effects of the present disclosure is that the LED display provided by the present disclosure is capable of adopting the technical feature of "the first adhesive layer being disposed on the wafer-level substrate, and each of the first light-emitting assemblies including a plurality of first LED structures disposed on the first adhesive layer," so that "each of the first light-emitting assemblies including a plurality of the first LED structures" and "the wafer-level substrate including a plurality of the control circuits" can be connected to each other by the first adhesive layer.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the following detailed description and accompanying drawings.

DETAILED DESCRIPTION OF THE EXEMPLARY EMBODIMENTS

Figure 1:
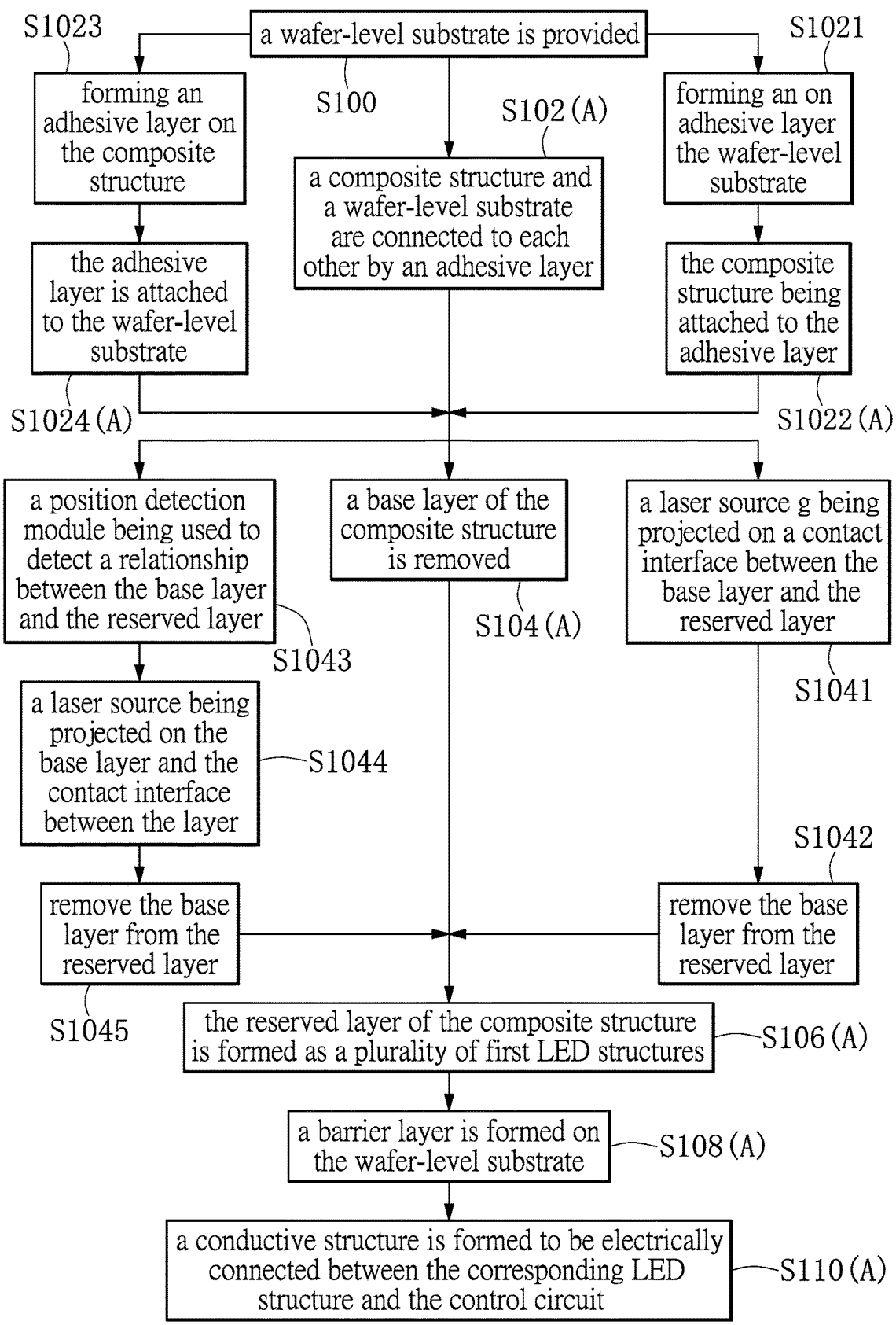
FIG. 1 is a flow chart of a method of manufacturing an LED display according to a first embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

First Embodiment

Figure 2:
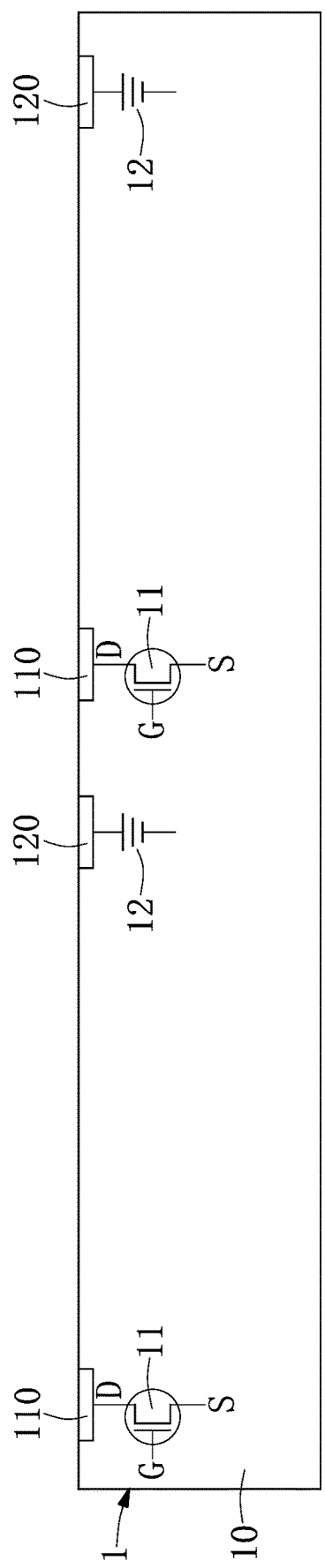
FIG. 2 is a schematic view of step S100 of the method of manufacturing the LED display according to the first embodiment of the present disclosure.

Referring to FIG. 1, a first embodiment of the present disclosure provides an LED display, including:

Firstly, as shown in FIG. 1 and FIG. 2, a wafer-level substrate 1 is provided. The wafer-level substrate 1 includes a plurality of control circuits 11, each of the control circuits 11 has a conductive contact 110 (step S100). Further, the wafer-level substrate 1 includes a wafer 10 and a plurality of ground circuits 12 built in the wafer 10, and the plurality of control circuits 11 are built in the wafer 10. In addition, the conductive contact 110 of each of the control circuits 11 is exposed outside the wafer 10, and each of the ground circuits 12 has a ground contact 120 exposed outside the wafer 10. For example, the wafer-level substrate can be one of a Polished Silicon Wafer, an Epitaxial Silicon Wafer, an Argon Anneal Silicon Wafer, a Hai Silicon Wafer and a Silicon on Insulator Silicon Wafer. The control circuit can be a CMOS (Complementary Metal-Oxide-Semiconductor) control circuit, and the CMOS control circuit has a source S, a drain D and a gate G However, the present disclosure is not limited thereto.

Figure 3:
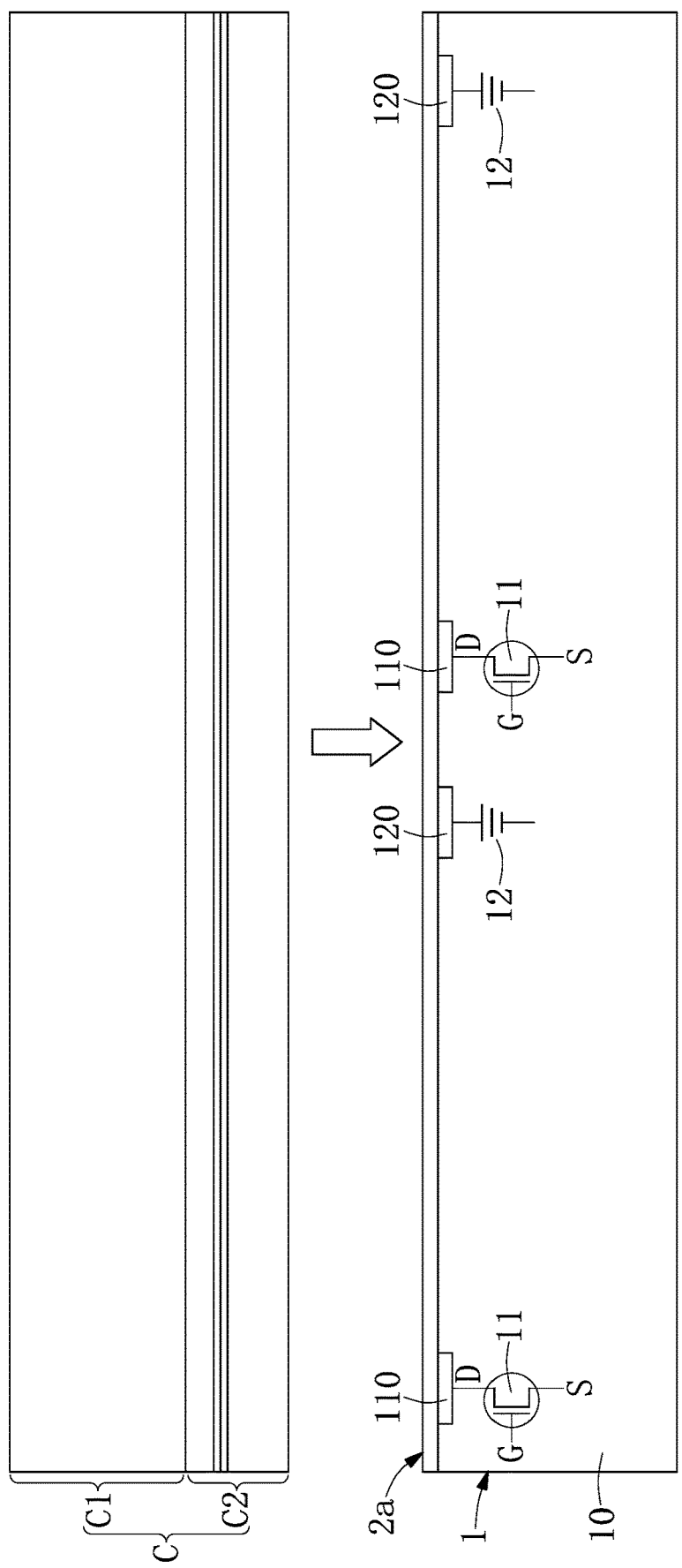
FIG. 3 is a schematic view of step S1021 of the method of manufacturing the LED display according to the first embodiment of the present disclosure.
Figure 4:
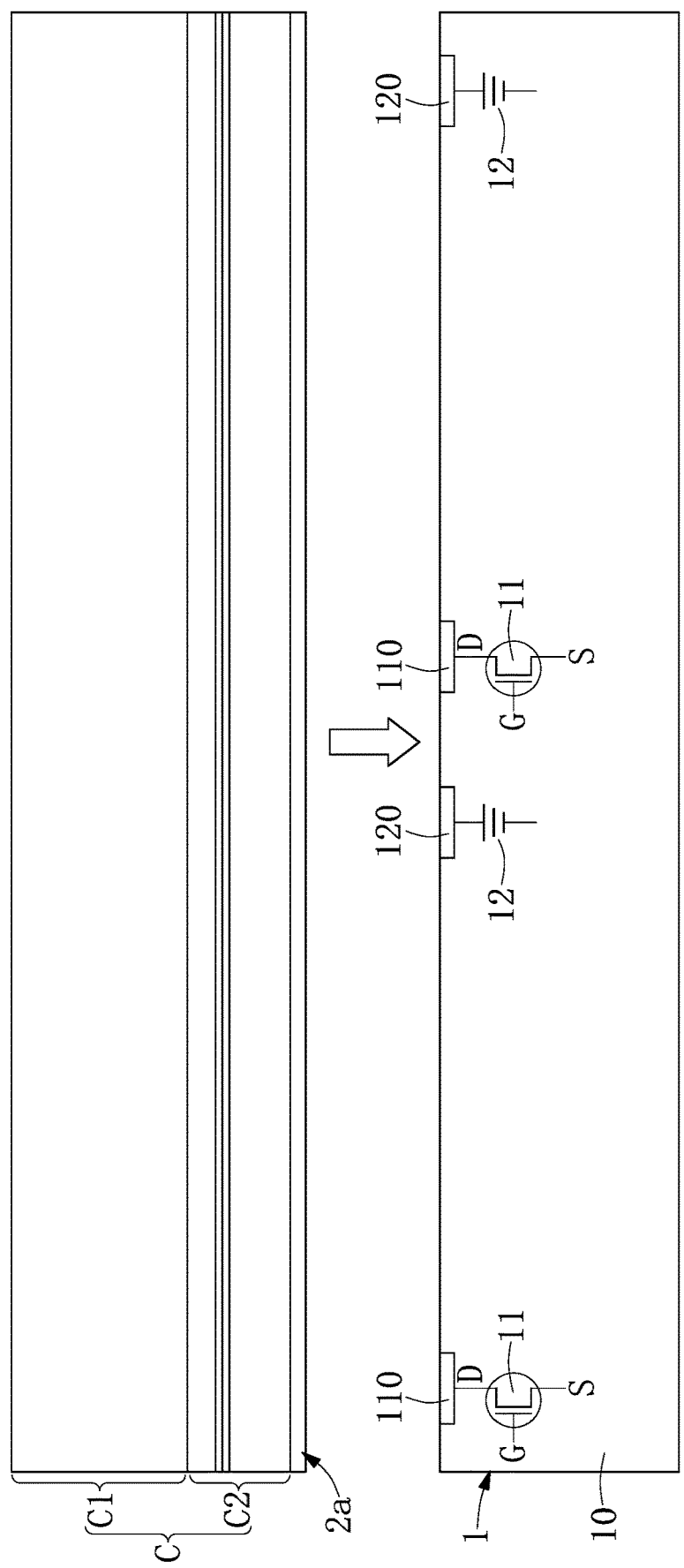
FIG. 4 is a schematic view of step S1023 of the method of manufacturing the LED display according to the first embodiment of the present disclosure.

Further, as shown in FIG. 1, FIG. 3 and FIG. 4, a composite structure C and a wafer-level substrate 1 are connected to each other by a first adhesive layer 2a (step S102(A)). For example, the first adhesive layer 2a can have the same or similar thermal expansion coefficient as the wafer-level substrate 1, and the first adhesive layer 2a may be one of a Polyetheretherketone (PEEK) first adhesive layer, a Benzocyclobutene (BCB) first adhesive layer and a first adhesive layer of Hydrogen Silsesquioxane (HSQ). However, the present disclosure is not limited thereto.

Figure 5:
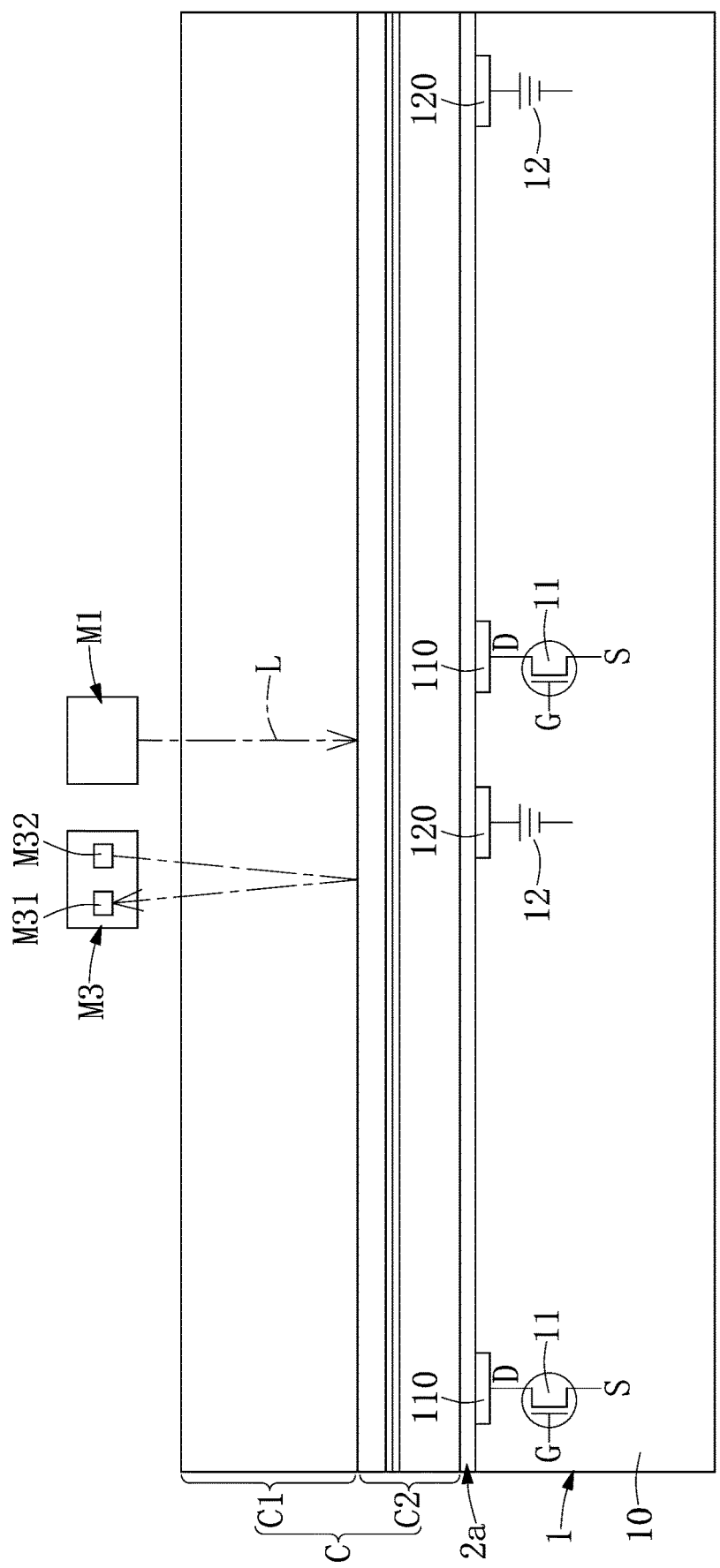
FIG. 5 is a schematic view of step S102(A) of the method of manufacturing the LED display according to the first embodiment of the present disclosure.

For example, as shown in FIG. 1, FIG. 3 and FIG. 5, the step S102 of the present disclosure further includes: firstly, as shown in FIG. 3, forming a first adhesive layer 2a on the wafer-level substrate 1 (step S1021); next, as shown in FIG. 5, attaching the composite structure C to the first adhesive layer 2a so that the composite structure C and the wafer-level substrate 1 are connected to each other (step S1022 (A)). However, the above-mentioned examples illustrate only one of the embodiments and the present disclosure is not limited thereto.

For example, as shown in FIG. 1, FIG. 4 and FIG. 5, the step S102 of the present disclosure further includes: firstly, as shown in FIG. 4, forming a first adhesive layer 2a on the composite structure C (step S1023); next, as shown in FIG. 5, the first adhesive layer 2a is attached to the wafer-level substrate 1 so that the composite structure C and the wafer-level substrate 1 are connected to each other (step S1024 (A)). However, the above-mentioned examples illustrate only one of the embodiments and the present disclosure is not limited thereto.

Figure 6:
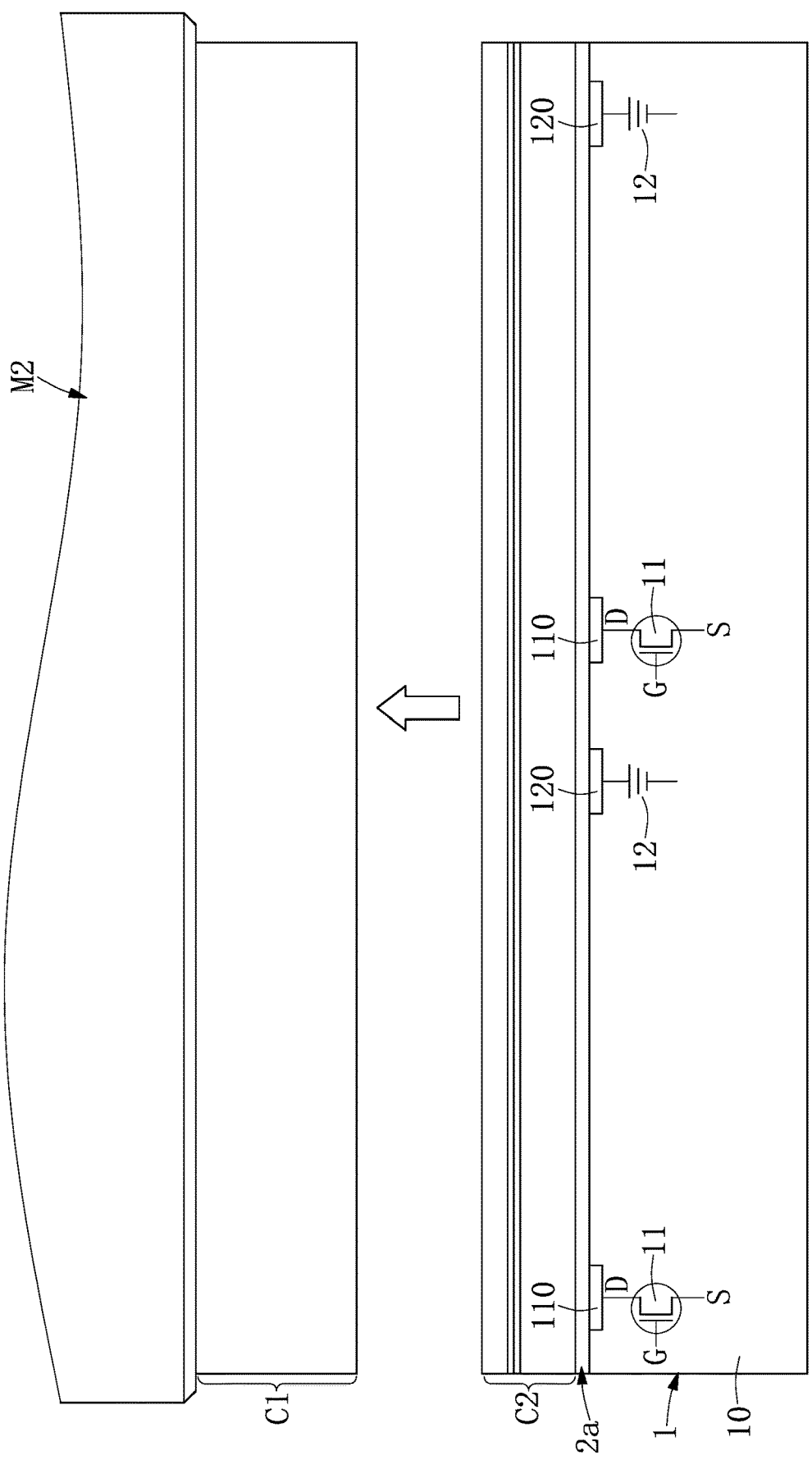
FIG. 6 is a schematic view of step S104(A) of the method of manufacturing the LED display according to the first embodiment of the present disclosure.

Further, as shown in FIG. 1, FIG. 5 and FIG. 6, a base layer C1 of the composite structure C is removed while a reserved layer C2 of the composite structure C is reserved (step S104(A)). For example, the base layer C1 of the composite structure C may be a sapphire material layer, and the reserved layer C2 of the composite structure C may be a gallium nitride material layer. Furthermore, the base layer C1 can also be a quartz base layer, a glass base layer, a silicon base layer or a base layer of any material. However, the present disclosure is not limited thereto.

For example, as shown in FIG. 1, FIG. 5 and FIG. 6, step S104 of the present disclosure further includes: firstly, as shown in FIG. 5, projecting a laser source L generated by a laser generation module M1 on a contact interface between the base layer C1 and the reserved layer C2 so as to reduce the bonding force between the base layer C1 and the reserved layer C2 (step S1041); next, as shown in FIG. 6, using a remove module M2 to remove the base layer C1 from the reserved layer C2, so that the reserved layer C2 remains on the first adhesive layer 2a and is exposed outside (step S1042). It should be noted that, the remove module M2 can be a vacuum nozzle or any clamping device. However, the above-mentioned examples illustrate only one of the embodiments and the present disclosure is not limited thereto.

For example, as shown in FIG. 1, FIG. 5 and FIG. 6, the step S104 of the present disclosure further includes: firstly, as shown in FIG. 5, using a position detection module M3, including at least one sensing element M31 for receiving a detection wave, to detect a relationship between the base layer C1 and the reserved layer C2 (step S1043); then, as shown in FIG. 5, projecting a laser source L generated by a laser generation module M1 on the contact interface between the base layer C1 and the reserved layer C2 so as to reduce the bonding force between the base layer C1 and the reserved layer C2 (step S1044); next, as shown in FIG. 6, using a remove module M2 to remove the base layer C1 from the reserved layer C2, so that the reserved layer C2 remains on the first adhesive layer 2a and is exposed outside (step S1045). It should be noted that the position detection module M3 may further include an emitting element M32 for emitting a detection wave, and the detection wave received by the sensing element M31 may be provided by the emitting element M32 or may be provided by the laser generation module M1. However, the above-mentioned examples illustrate only one of the embodiments and the present disclosure is not limited thereto.

Figure 7:
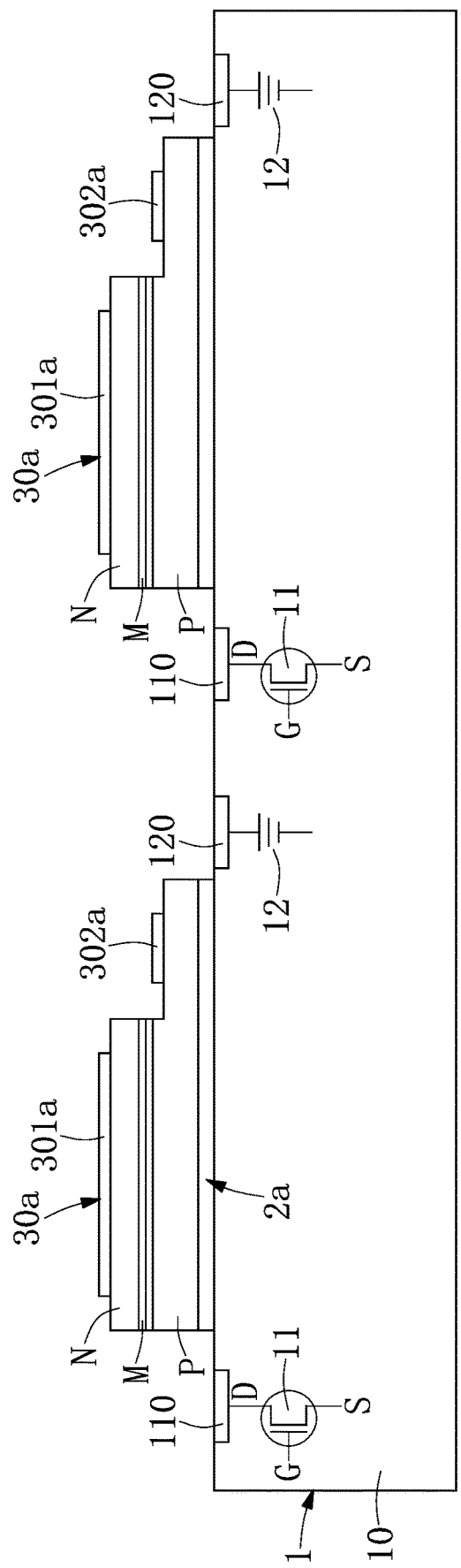
FIG. 7 is a schematic view of step S106(A) of the method of manufacturing the LED display according to the first embodiment of the present disclosure.

Further, as shown in FIG. 1, FIG. 6, and FIG. 7, the reserved layer C2 of the composite structure C is formed as a plurality of first LED structures 30a disposed on the first adhesive layer 2a (step S106(A)). For example, the reserved layer C2 can be fabricated into a plurality of first LED structures 30a by semiconductor or non-semiconductor processing. Each first LED structure 30a has a first positive electrode 301a and a first negative electrode 302a, and the first positive electrode 301a and the first negative electrode 302a are additionally fabricated onto the corresponding first LED structure 30a by subsequent processing. In addition, each of the first LED structures 30a includes an n-type conductive layer N, a light-emitting layer M, and a p-type conductive layer P. The n-type conductive layer N may be an n-type gallium nitride (n-GaN) material layer, the light-emitting layer M may be a multiple quantum well (MQW) structural layer, and the p-type conductive layer P may be a p-type gallium nitride (p-GaN) material layer. However, the above-mentioned examples illustrate only one of the embodiments and the present disclosure is not limited thereto.

Figure 8:
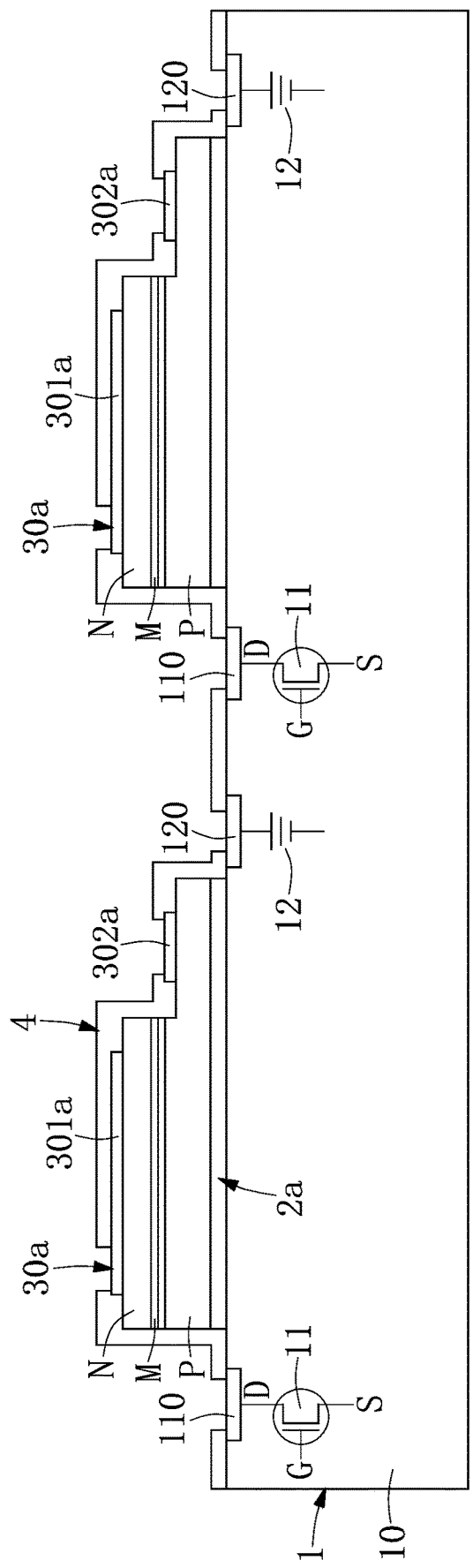
FIG. 8 is a schematic view of step S108(A) of the method of manufacturing the LED display according to the first embodiment of the present disclosure.

Further, as shown in FIG. 1, FIG. 7, and FIG. 8, a barrier layer 4 is formed on the wafer-level substrate 1 and the plurality of first LED structures 30a (step S108(A)). For example, the conductive contact 110 of each control circuit 11, the ground contact 120 of each ground circuit 12, and the first positive electrode 301a and the first negative electrode 302a of each first LED structure 30a are can be exposed by the barrier layer 4, and may be completely exposed or partially exposed. It should be noted that the barrier layer 4 provided by the present disclosure may be a single insulator or a plurality of insulators. However, the present disclosure is not limited thereto.

Figure 9:
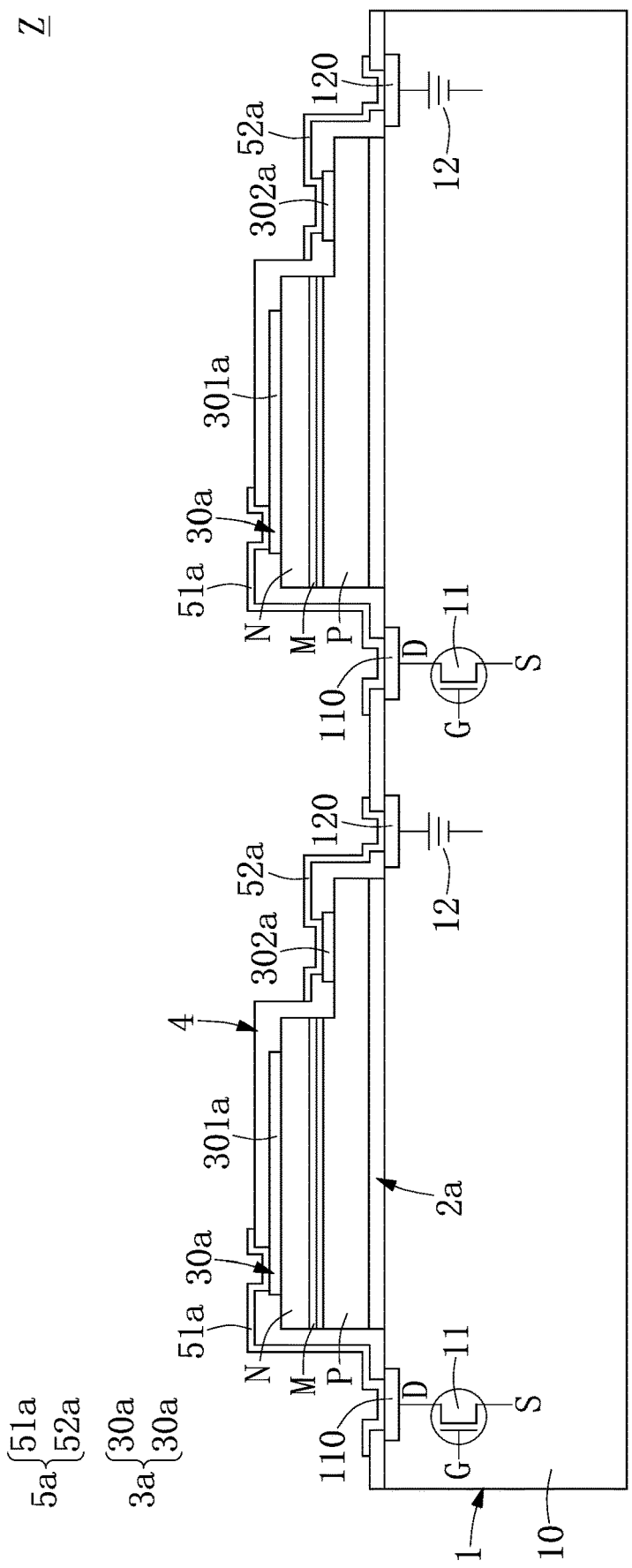
FIG. 9 is a schematic view of step S110(A) of the method of manufacturing the LED display according to the first embodiment of the present disclosure.

Finally, as shown in FIG. 1, FIG. 8, and FIG. 9, a first conductive structure 5a is formed to be electrically connected between the corresponding first LED structure 30a and the control circuit 11 (step S110(A)). For example, the first LED structure 30a may be a red light-emitting diode, a green light-emitting diode, or a blue light-emitting diode, but the present disclosure is not limited thereto.

Further, as shown in FIG. 9, the first conductive structure 5a includes a plurality of first positive conductive layers 51a and a plurality of first negative conductive layers 52a. Each of the first negative conductive layers 51a is electrically connected between the corresponding first negative electrode 301a and the corresponding conductive contact 110, and each of the first negative conductive layers 52a is electrically connected between the corresponding first negative electrode 302a and the corresponding ground contact 120.

Furthermore, as shown in FIG. 9, each of the first positive conductive layers 51a can extend along the barrier layer 4 and completely cover the corresponding first positive electrode 301a and the corresponding conductive contact 110, and each of the first negative conductive layers 52a can extend along the barrier layer 4 and completely cover the corresponding first negative electrode 302a and the corresponding ground contact 120.

In summary, as shown in FIG. 9, the first embodiment of the present disclosure provides an LED display Z (for example, a micro LED display or a mini LED display), which includes: a wafer-level substrate 1, a first adhesive layer 2a, and a plurality of first light-emitting assembly 3a and a first conductive structure 5a. The wafer-level substrate 1 includes a plurality of control circuits 11. Each of the control circuits 11 has a conductive contact 110. The first adhesive layer 2a is disposed on the wafer-level substrate 1. The first light-emitting assembly 3a includes a plurality of first LED structures 30a disposed on the first adhesive layer 2a. The first conductive structure 5a is electrically connected between the corresponding first LED structure 30a and the control circuit 11.

For example, as shown in FIG. 9, a first embodiment of the present disclosure provides an LED display Z, which includes: a wafer-level substrate 1, a first adhesive layer 2a, a plurality of first light-emitting assemblies 3a, a barrier layer 4, and a first conductive structure 5a. The wafer-level substrate 1 includes: a wafer 10, a plurality of control circuits 11 built in the wafer 10, and a plurality of ground circuits 12 built in the wafer 10. Each control circuit 11 has a conductive contact 110 exposed outside the wafer 10. Each ground circuit 12 has a ground contact 120 exposed outside the wafer 10. The first adhesive layer 2a is disposed on the wafer 10. The first light-emitting assembly 3a includes a plurality of first LED structures 30a disposed on the first adhesive layer 2a without contacting the wafer-level substrate 1. Each first LED structure 30a has a first positive electrode 301a and a first negative electrode 302a. The barrier layer 4 is formed on the wafer-level substrate 1 and the first light-emitting assembly 3a. The conductive contact 110 of each of the control circuits 11, the ground contact 120 of each of the ground circuits 12, and the first positive electrode 301a and the first negative electrode 302a of each of the first LED structures 30a are exposed by the barrier layer 4. The first conductive structure 5a includes a plurality of first positive conductive layers 51a and a plurality of first negative conductive layers 52a. Each of the first positive conductive layers 51a is electrically connected between the corresponding first positive electrode 301a and the corresponding conductive contact 110. Each of the first negative conductive layers 52a is electrically connected between the corresponding first negative electrode 302a and the corresponding ground contact 120. Therefore, the first LED structure 30a and the wafer-level substrate 1 can be separated from each other by the first adhesive layer 2a without contacting each other.

Second Embodiment

Figure 10:
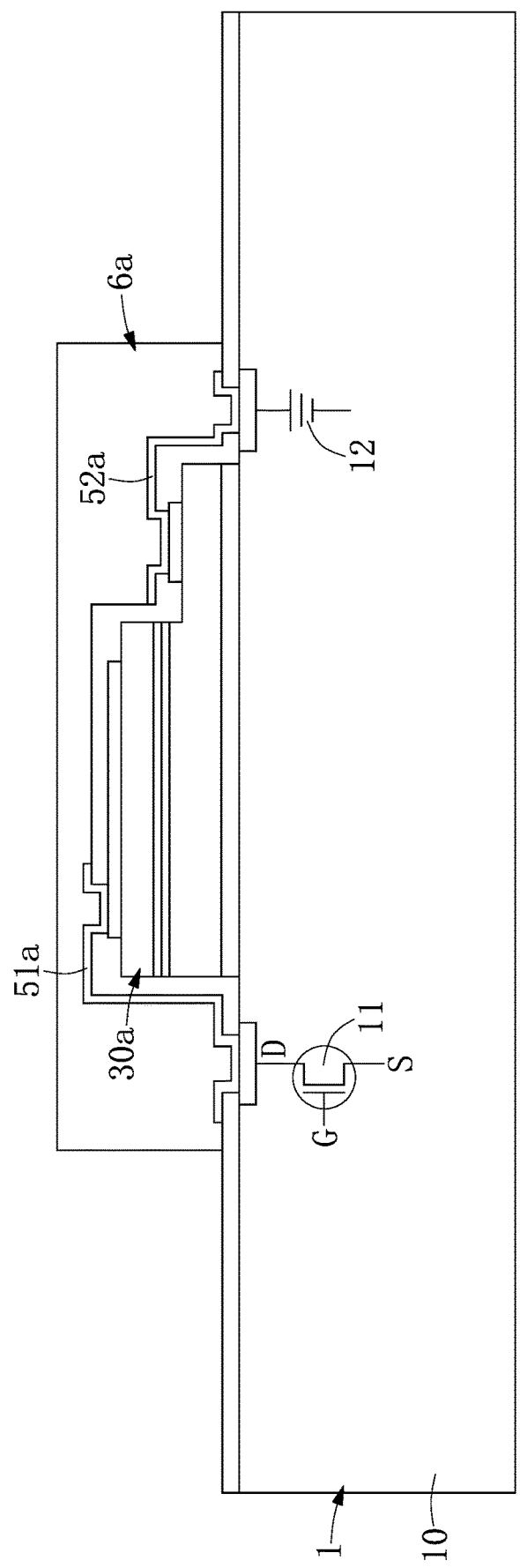
FIG. 10 is a first schematic view of one of the manufacturing methods of the LED display according to a second embodiment of the present disclosure.

Referring to FIG. 10 to FIG. 19, a second embodiment of the present disclosure provides an LED display Z' and a method for manufacturing an LED display. The manufacturing method of the LED display provided by the second embodiment includes: firstly, as shown in FIG. 9 and FIG. 10, forming a first insulation layer 6a on the first light-emitting assembly 3a of the LED display Z. The first insulation layer 6a provided by the present disclosure may be a single insulator or a plurality of insulators.

Figure 11:
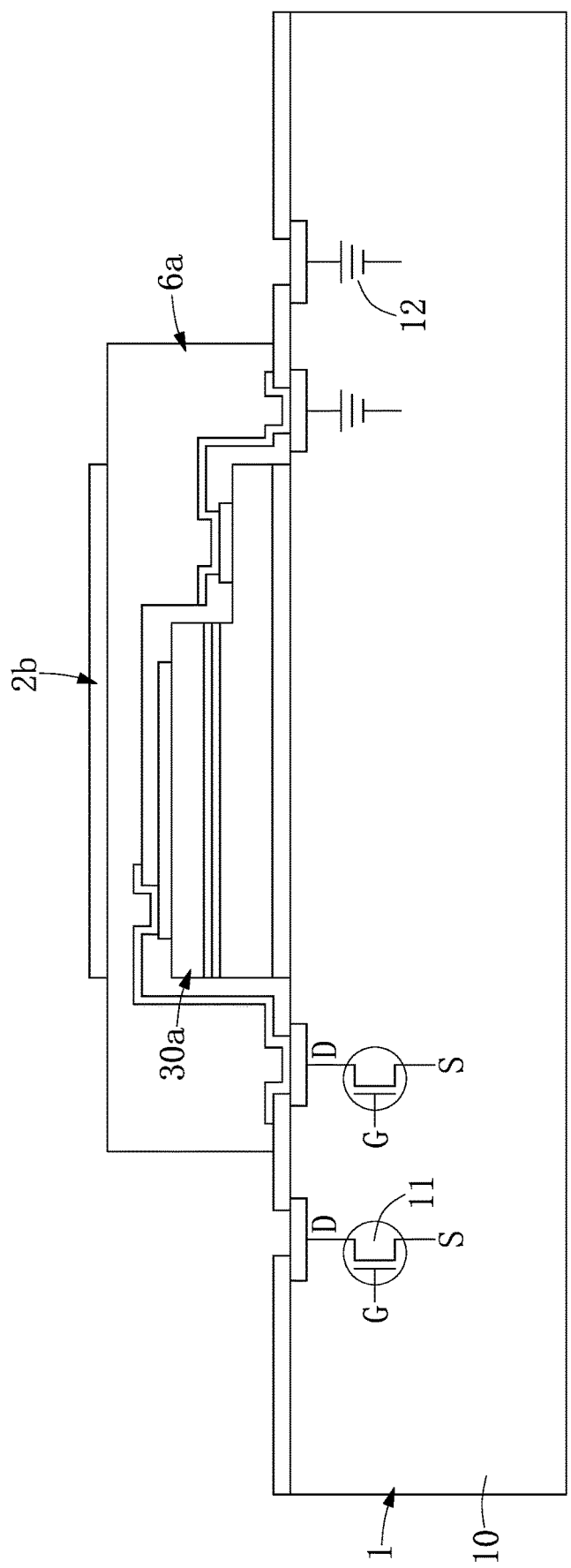
FIG. 11 is a second schematic view of one of the manufacturing methods of the LED display according to the second embodiment of the present disclosure.

Further, as shown in FIG. 11, a second adhesive layer 2b is formed on the first insulation layer 6a, and at least one composite structure (not shown) and the LED display Z are connected to each other through the second adhesive layer 2b. For example, the thermal expansion coefficient of the second adhesive layer 2b is the same as or similar to the thermal expansion coefficient of the first insulation layer 6a, and the second adhesive layer 2b may be one of a Polyetheretherketone (PEEK) second adhesive layer, a Benzocyclobutene (BCB) second adhesive layer and a Hydrogen Silsesquioxane (HSQ) second adhesive layer, but the present disclosure is not limited thereto. The second adhesive layer 2b is formed on the first insulation layer 6a, and then the at least one composite structure is attached to the second adhesive layer 2b; wherein the composite structure can be a substrate (for example, of sapphire, but not limited thereto) having a plurality of second light-emitting assembly 3b structures. A plurality of second light-emitting assemblies 3b of the composite structure are attached to the second adhesive layer 2b by inverting the composite structure, thereby interconnecting the composite structure and the LED display Z'.

Figure 12:
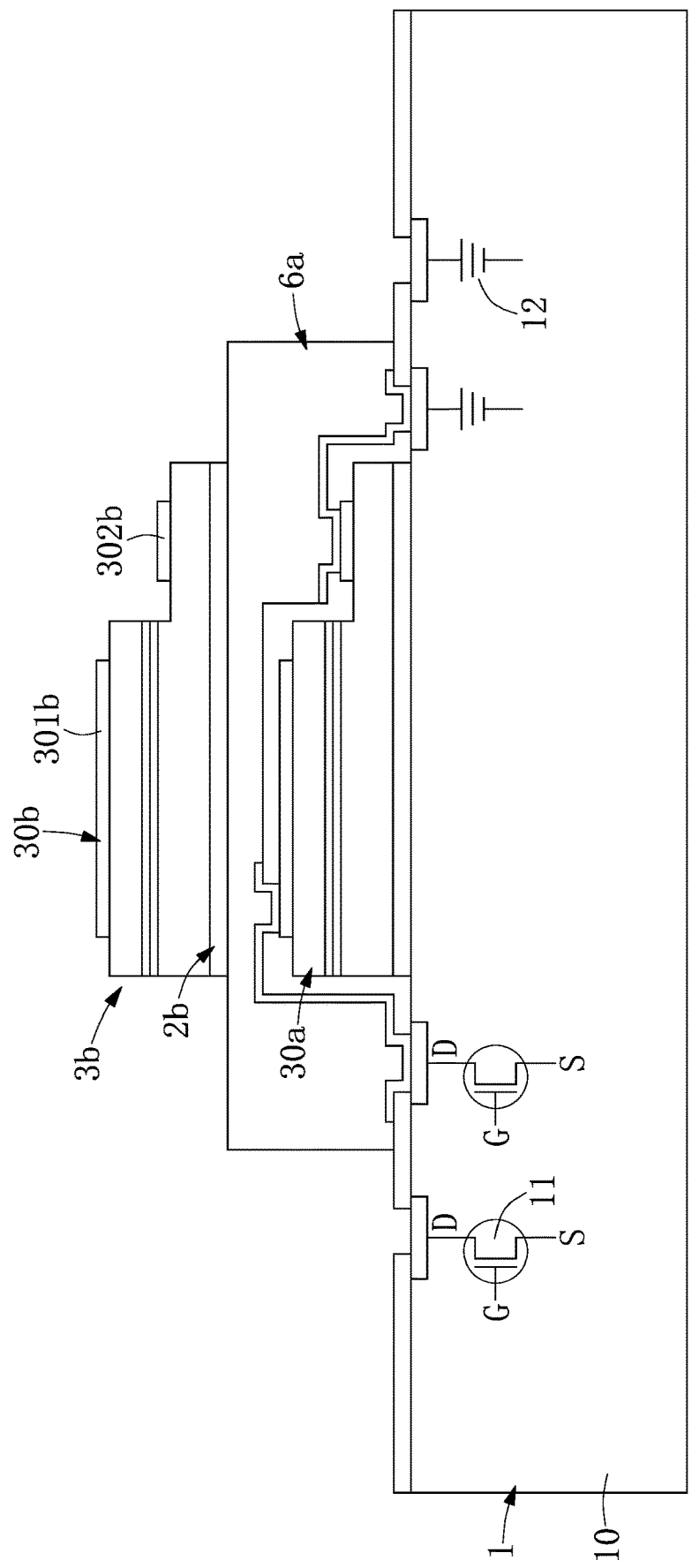
FIG. 12 is a third schematic view of one of the manufacturing methods of the LED display according to the third embodiment of the present disclosure.

Further, as shown in FIG. 12, the substrate of the composite structure is removed and that the plurality of second light-emitting assemblies 3b of the composite structure are reserved on the second adhesive layer 2b. For example, the LED display Z' provided by the present embodiment, the manner of removing the substrate and reserving the plurality of second light-emitting assemblies 3b on the second adhesive layer 2b may be similar to those disclosed in the above-mentioned first embodiment, and the removal is performed by using the laser generation module M1, the remove module M2, and the position detection module M3, thus will not be specifically described herein. As shown in FIG. 9, each second light-emitting assembly 3b of the composite structure may be a light-emitting diode structure including an n-type conductive layer N, a light-emitting layer M, and a p-type conductive layer P. Furthermore, each of the second light-emitting assemblies 3b includes a second LED structure 30b that is disposed on the second adhesive layer 2b without contacting the first conductive structure 5a, and each of the second LED structures 30b has a second positive electrode 301b and a second negative electrode 302b.

Figure 13:
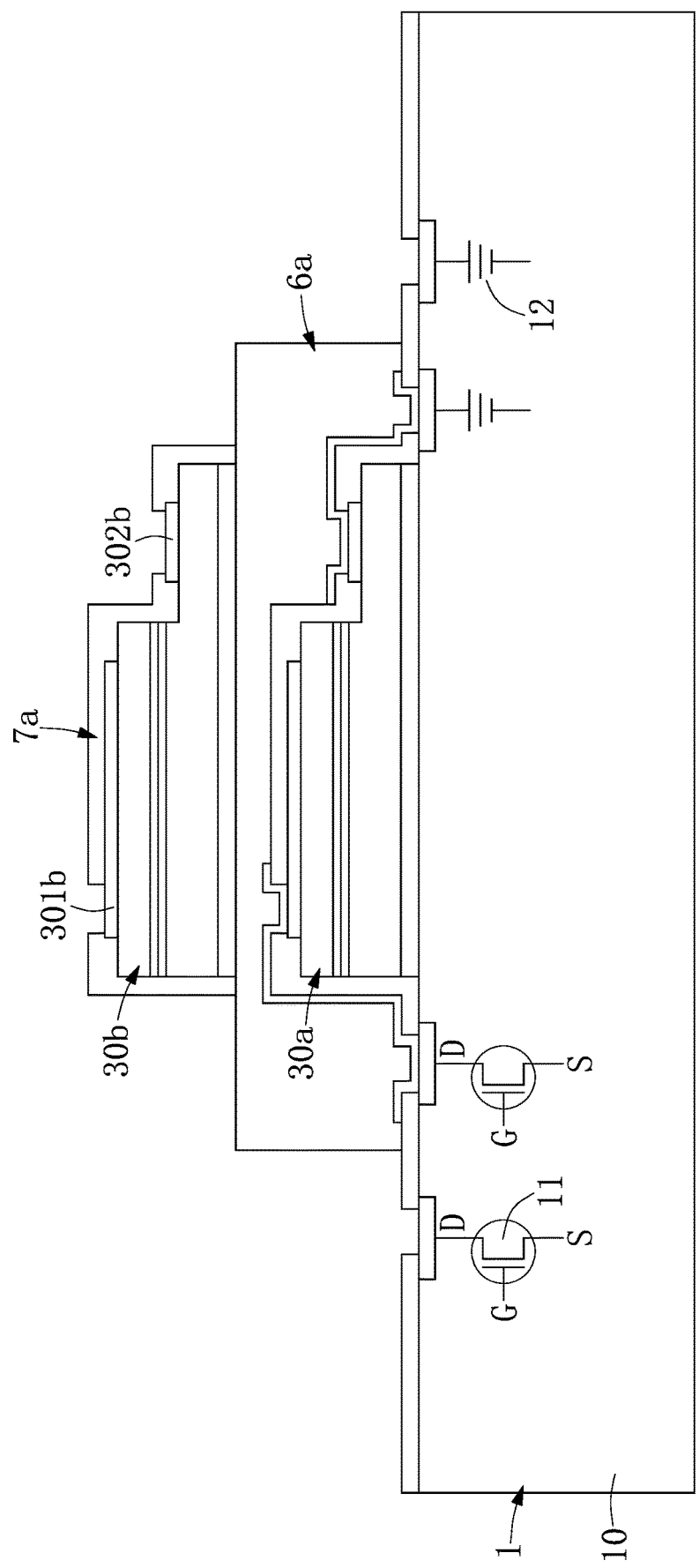
FIG. 13 is a fourth schematic view of one of the manufacturing methods of the LED display according to the second embodiment of the present disclosure.

Further, as shown in FIG. 13, a first spacer layer 7a is formed on the first insulation layer 6a and the plurality of second LED structures 30b. For example, the conductive contact 110 of each control circuit 11, the ground contact 120 of each ground circuit 12, and the second positive electrode 301b and the second negative electrode 302b of each second LED structure 30b are exposed by the first spacer layer 7a, and may be completely exposed or partially exposed. It should be noted that the first spacer layer 7a provided by the present disclosure may be a single insulator or a plurality of insulators. However, the present disclosure is not limited thereto.

Figure 14:
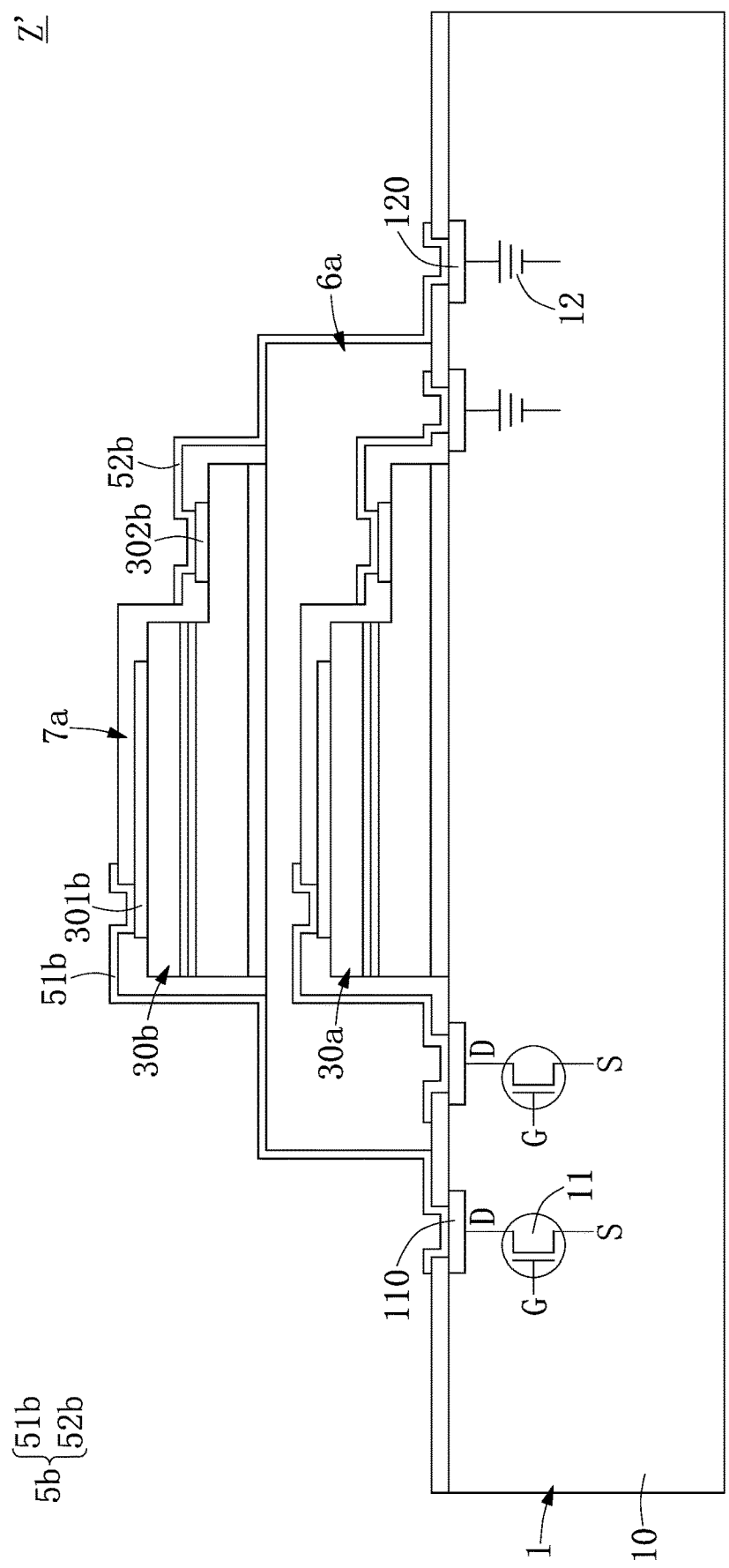
FIG. 14 is a fifth schematic view of one of the manufacturing methods of the LED display according to the second embodiment of the present disclosure.
Figure 15:
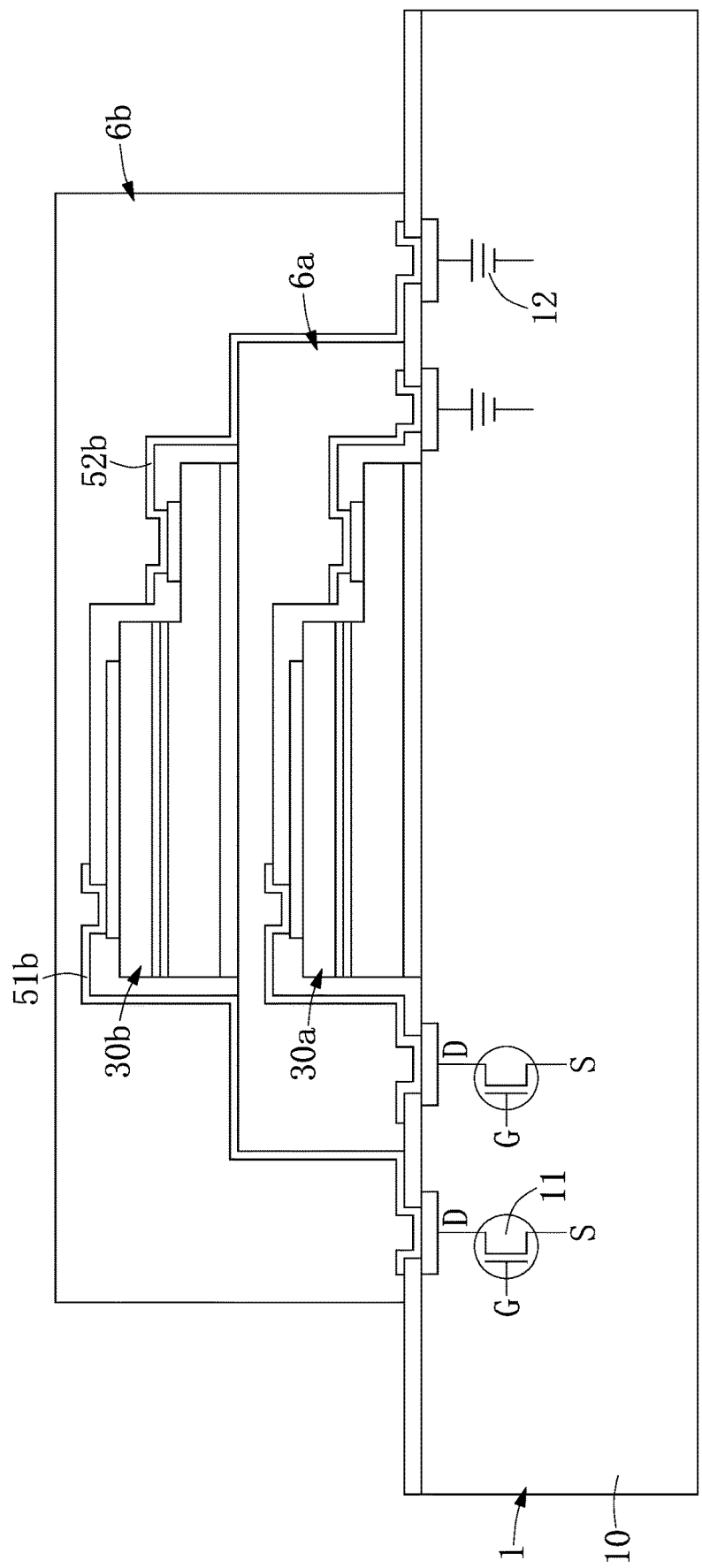
FIG. 15 is a first schematic view of another manufacturing method of an LED display according to the second embodiment of the present disclosure.
Figure 16:
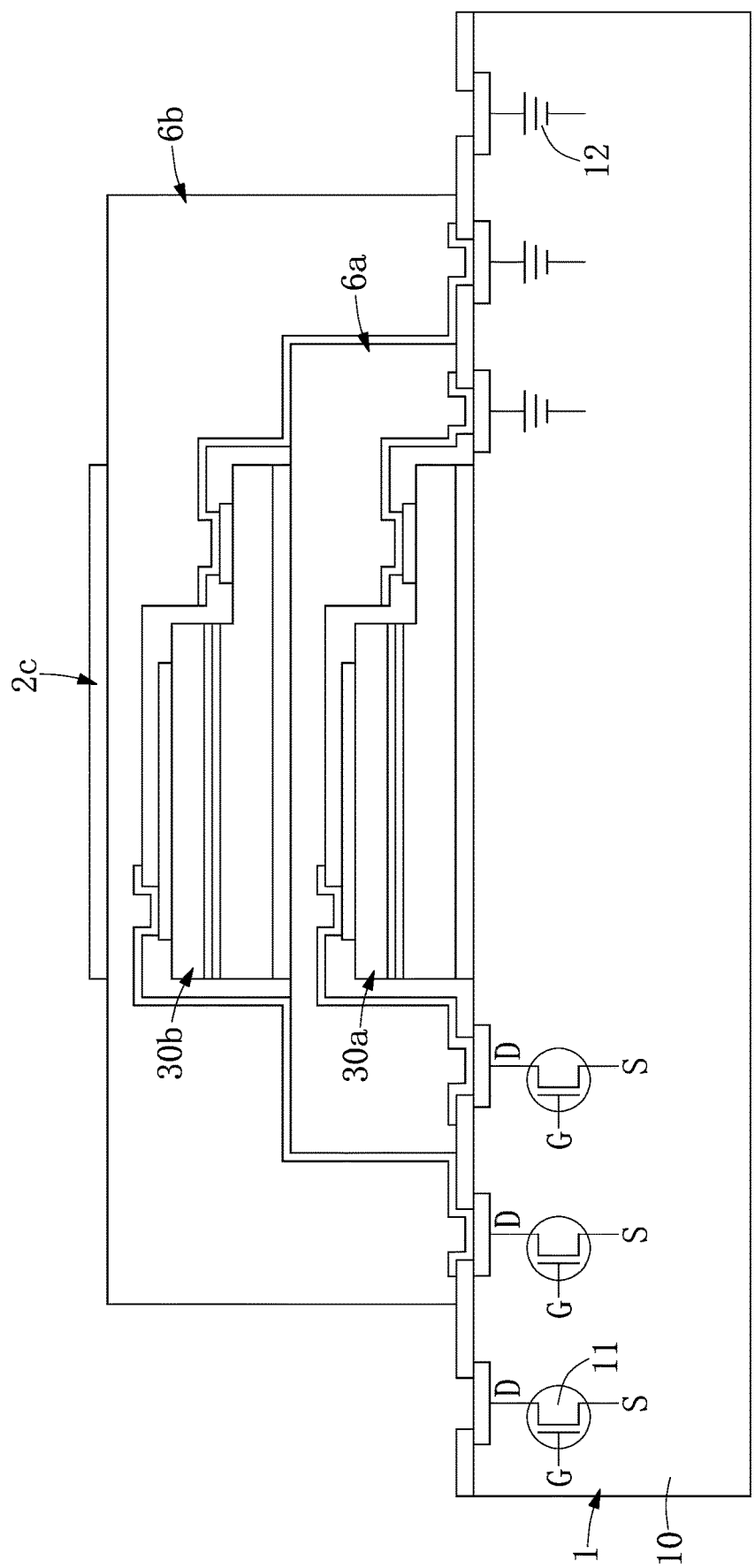
FIG. 16 is a second schematic view of the another manufacturing method of the LED display according to the second embodiment of the present disclosure.
Figure 17:
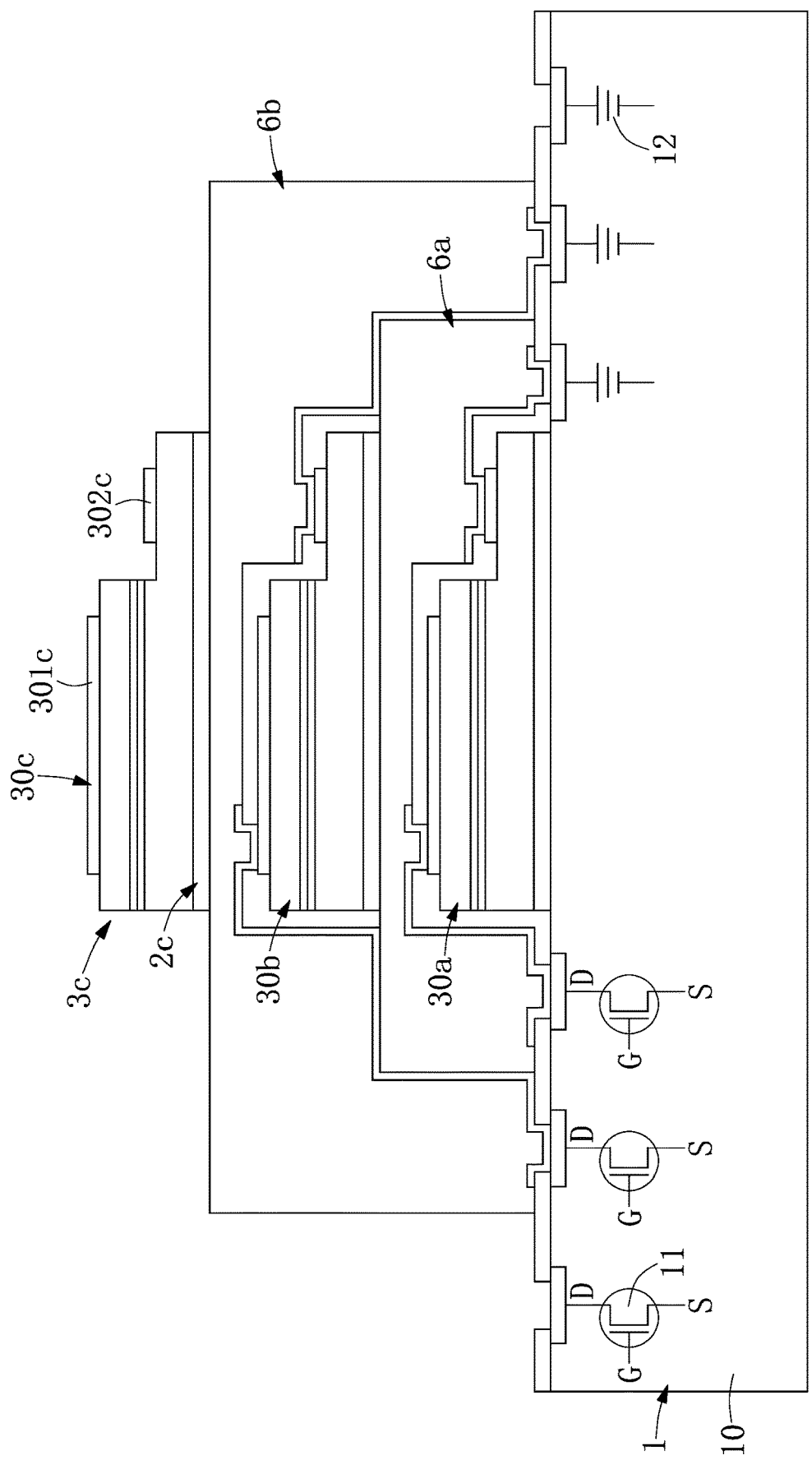
FIG. 17 is a third schematic view of the another manufacturing method of the LED display according to the second embodiment of the present disclosure.
Figure 18:
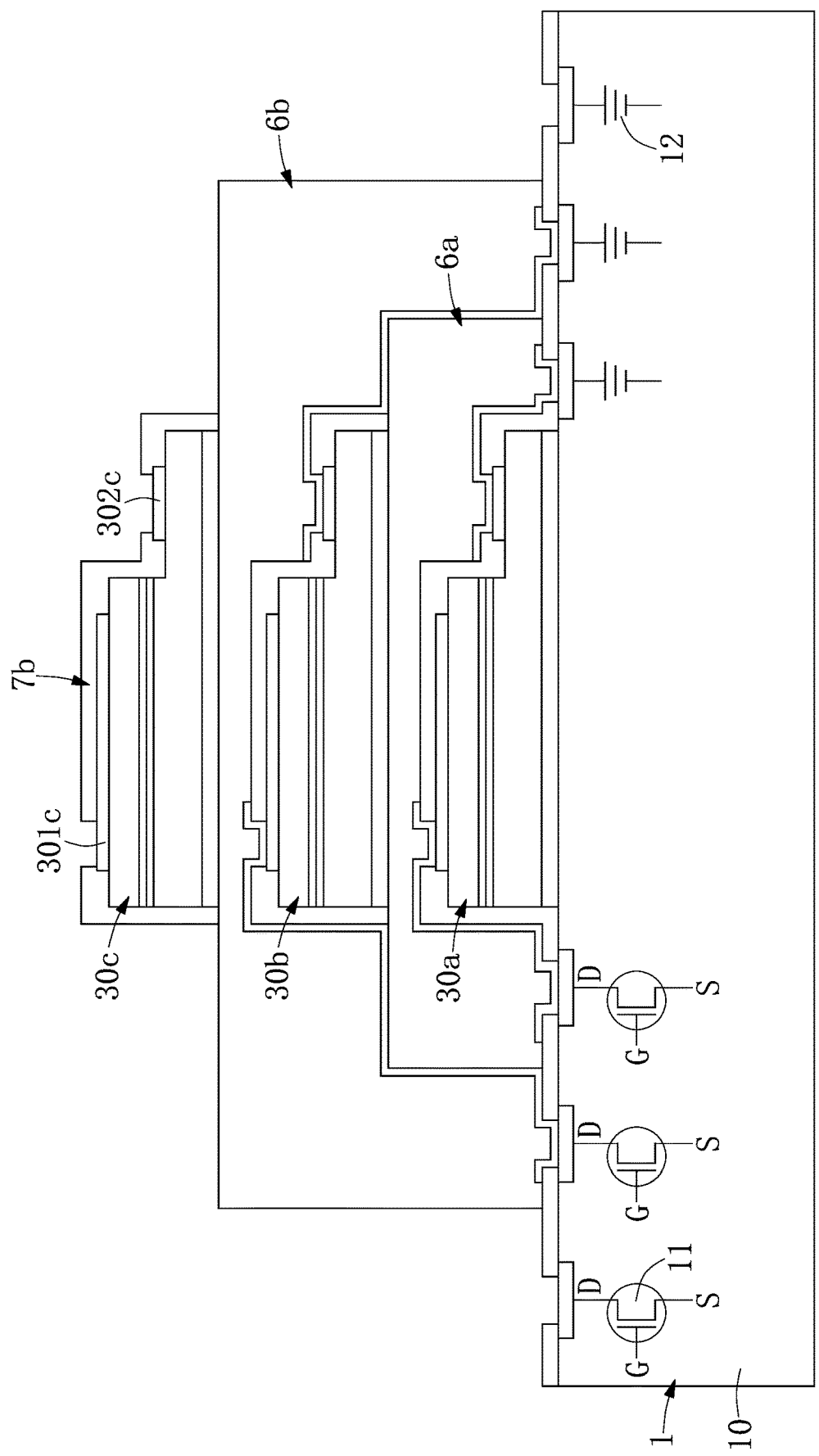
FIG. 18 is a fourth schematic view of the another manufacturing method of the LED display according to the second embodiment of the present disclosure.
Figure 19:
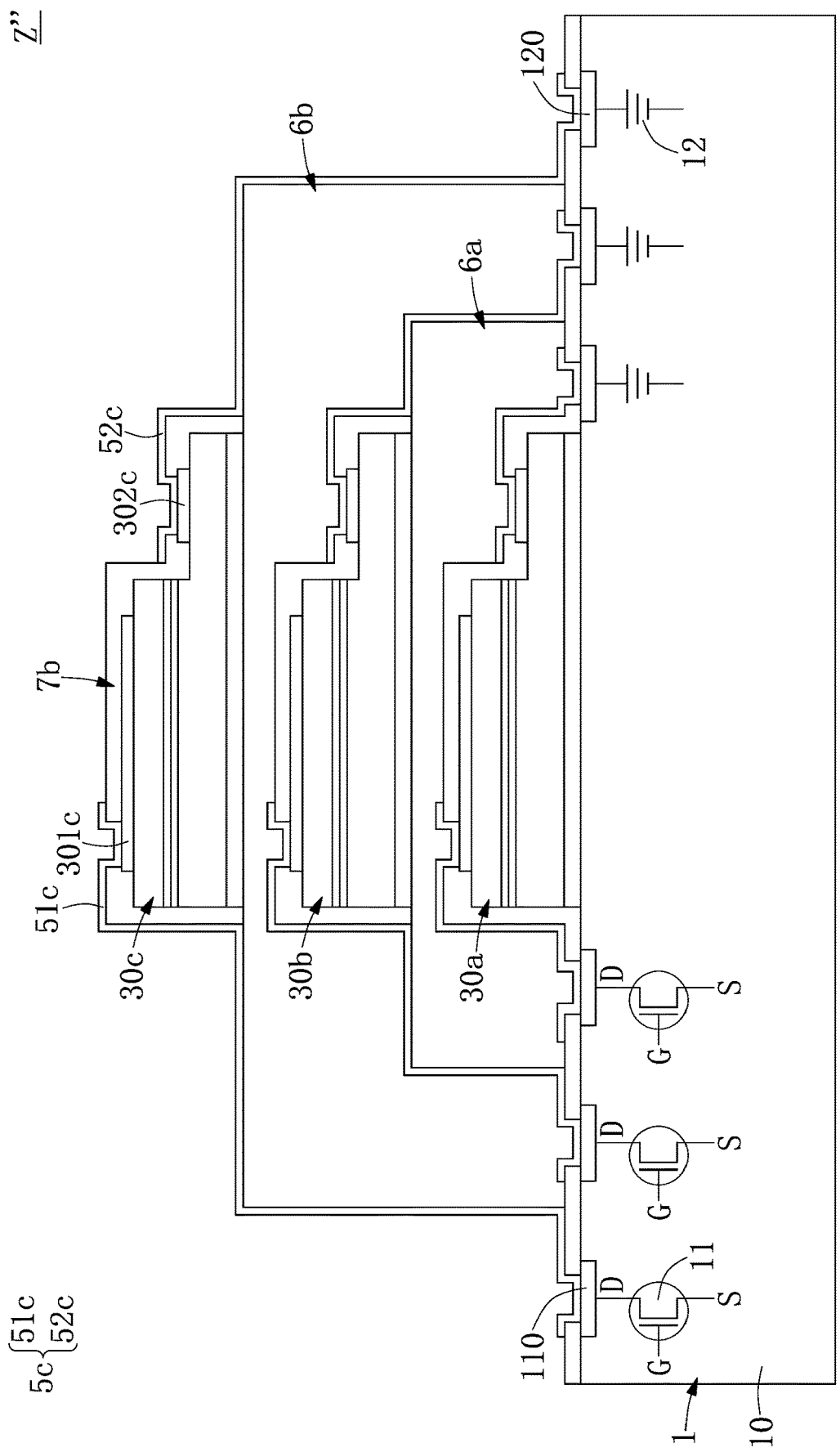
FIG. 19 is a fifth schematic view of the another manufacturing method of the LED display according to the second embodiment of the present disclosure.

Finally, as shown in FIG. 9 and FIG. 14, a second conductive structure 5b is formed to be electrically connected between the corresponding second light-emitting assembly 3b and the control circuit 11. For example, the second conductive structure 5b includes a plurality of second positive conductive layers 51b and a plurality of second negative conductive layers 52b. Each of the second positive conductive layers 51b is electrically connected between the corresponding second positive conductive layer 301b and the corresponding conductive contact 110, and each of the second negative conductive layers 52b is electrically connected between the corresponding second negative electrode 302b and the corresponding ground contact 120. Further, each of the second positive conductive layers 51b can extend along the first spacer layer 7a and completely cover the corresponding second positive conductive layer 51b and the corresponding conductive contact 110, and each of the second negative conductive layers 52b can extend along the first spacer layer 7a and completely cover the corresponding second negative electrode 302b and the corresponding ground contact 120.

It should be noted that, the LED display Z' and the LED display manufacturing method provided by the second embodiment of the present disclosure the LED display Z' used in the figure is only an example, and the present disclosure is not limited thereto.

Further, as shown in FIG. 10 to FIG. 14, an LED display Z' according to the second embodiment of the present disclosure further includes a first insulation layer 6a; compared with the LED display Z of the first embodiment, the LED display Z' further includes: a first insulation layer 6a, a second adhesive layer 2b, a plurality of second light-emitting assemblies 3b, a first spacer layer 7a, and a second conductive structure 5b. The first insulation layer 6a is disposed on the first conductive structure 5a. The second adhesive layer 2b is disposed on the first insulation layer 6a. Each of the second light-emitting assemblies 3b includes a plurality of second LED structures 30b that are disposed on the second adhesive layer 2b without contacting the first conductive structure 5a, and each of the second LED structures 30b has a second positive electrode 301b and a second negative electrode 302b. The first spacer layer 7a is formed on the first insulation layer 6a and the plurality of second light-emitting assemblies 3b. The second conductive structure 5b includes a plurality of second positive conductive layers 51b and a plurality of second negative conductive layers 52b. Each of the second positive conductive layers 51b is electrically connected between the corresponding second positive conductive layer 301b and the corresponding conductive contact 110, and each of the second negative conductive layers 52b is electrically connected between the corresponding second negative electrode 302b and the corresponding ground contact 120.

Thereby, in the second embodiment, the second light-emitting assembly 3b can be further stacked on each of the first light-emitting assembly 3a, so that the LED display Z' can respectively generate different colors by mixing a plurality of first light-emitting assemblies 3a and a plurality of second light-emitting assemblies 3b. Different colors of light are mixed to produce light sources of different colors.

Furthermore, referring to FIG. 15 to FIG. 19, the LED display Z' of the present disclosure can further repeat the above-described manufacturing method to obtain an LED display Z". Further, the specific manufacturing process of the LED display Z" of the present disclosure is similar to the manufacturing process of the LED display Z", and will not be specifically described herein.

Furthermore, compared with the above-mentioned LED display Z', the LED display Z" of the present disclosure further includes: a second insulation layer 6b, a third adhesive layer 2c, a plurality of third light-emitting assemblies 3c, a second spacer layer 7b, and a third conductive structure 5c. The second insulation layer 6b is disposed on the second conductive structure 5b. The third adhesive layer 2c is disposed on the second insulation layer 6b. Each third light-emitting assembly 3c includes a plurality of third LED structures 30c disposed on the third adhesive layer 2c without contacting the second conductive structure 5b, and each of the third LED structures 30c has a third positive electrode 301c and a third negative electrode 302c. The second spacer layer 7b is formed on the second insulation layer 6b and the plurality of third light-emitting assemblies 3c. The third conductive structure 5c includes a plurality of third positive conductive layers 51c and a plurality of third negative conductive layers 52c. Each of the third positive conductive layers 51c is electrically connected between the corresponding third positive electrode 301c and the corresponding conductive contact 110, and each of the third negative conductive layers 52c is electrically connected between the corresponding third negative electrode 302c and the corresponding ground contact 120.

It should be noted that, in the embodiment, the first light-emitting assembly 3a, the second light-emitting assembly 3b, and the third light-emitting assembly 3c are sequentially stacked, and the plurality of first LED structures 30a respectively correspond to the plurality of second LED structures 30b. The second LED structures 30b respectively correspond to a plurality of third LED structures 30c, and each of the first LED structures 30a, the corresponding second LED structures 30b and the third LED structures 30c are sequentially stacked to form a pixel. The first LED structure 30a, the second LED structure 30b, and the third LED structure 30c may be a red light-emitting diode, a green light-emitting diode, or a blue light-emitting diode, and the three may be the same, different, or two of the three may be the same, however the present disclosure is not limited thereto.

In conclusion, one of the beneficial effects of the present disclosure is that the LED display Z provided by the present disclosure is capable of adopting the technical feature of "the first adhesive layer 2a being disposed on the wafer-level substrate 1, and each of the first light-emitting assemblies 3a including a plurality of first LED structures 30a disposed on the first adhesive layer 2a" or "connecting a plurality of composite structure C and a wafer-level substrate 1 through a first adhesive layer 2a, removing a base layer C1 of each composite structure C so as to reserve a reserved layer C2 of each composite structure C, and the reserved layer C2 of each composite structure C being formed into a plurality of first LED structures 30a disposed on the first adhesive layer 2a" so that "each of the first light-emitting assemblies 3a including a plurality of the first LED structures 30a" and "the wafer-level substrate 1 including a plurality of the control circuits 11" can be connected to each other by the first adhesive layer.

It should be noted that, the reserved layer C2 can be fabricated into a plurality of first LED structures 30a by semiconductor processing, so that the size of the first LED structure 30a can be reduced, and the distance between two adjacent first LED structures 30a can be shortened so as to effectively improve the image resolution of LED display Z.

Further, the second light-emitting assembly 3b can be further stacked on each of the first light-emitting assembly 3a, so that the LED display Z' can respectively generate different colors by mixing a plurality of first light-emitting assemblies 3a and a plurality of second light-emitting assemblies 3b. Different colors of light are mixed to produce light sources of different colors. The third light-emitting assembly 3 is further stacked on the second light-emitting assembly 3b, and the plurality of first light-emitting assembly 3a, the plurality of second light-emitting assemblies 3b, and the plurality of third light-emitting assemblies 3c are used so that the LED display Z" respectively generate different light colors and perform color mixing, thereby producing light sources of different colors.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. An LED display, comprising:
a wafer-level substrate including a wafer, a plurality of control circuits built in the wafer, and a plurality of ground circuits built in the wafer, each of the control circuits having a conductive contact exposed outside the wafer, and each of the ground circuits having a ground contact exposed outside the wafer;
a first adhesive layer disposed on the wafer;
a plurality of first light-emitting assemblies, each of the first light-emitting assemblies including a plurality of first LED structures that are disposed on the first adhesive layer without contacting the wafer-level substrate, and each of the first LED structures having a first positive electrode and a first negative electrode;
a barrier layer formed on the wafer-level substrate and the plurality of first light-emitting assemblies; and
a first conductive structure including a plurality of first positive conductive layers and a plurality of first negative conductive layers, each of the first positive conductive layers being electrically connected between the corresponding first positive electrode and the corresponding conductive contact, and each of the first negative conductive layers being electrically connected between the corresponding first negative electrode and the corresponding ground contact;
wherein the control circuits are respectively separate from the first LED structures by the first adhesive layer and the barrier layer.

2. The LED display according to claim 1, wherein the wafer-level substrate is one of a Polished Silicon Wafer, an Epitaxial Silicon Wafer, an Argon Anneal Silicon Wafer, a Hai Silicon Wafer and a Silicon on Insulator Silicon Wafer, and the control circuit is a CMOS control circuit; wherein the first adhesive layer has the same or approximately the same thermal expansion coefficient as the wafer-level substrate, and the first adhesive layer is one of a Polyetheretherketone first adhesive layer, a Benzocyclobutene first adhesive layer and a Hydrogen Silsesquioxane first adhesive layer; wherein each of the first LED structures includes an n-type conductive layer, a light-emitting layer, and a p-type conductive layer; the n-type conductive layer is an n-type gallium nitride material layer, the light-emitting layer is a multi-quantum well structure layer, and the p-type conductive layer is a p-type gallium nitride material layer; wherein each of the first positive conductive layers extends along the barrier layer and completely covers the corresponding first positive electrode and the corresponding conductive contact, and each of the first negative conductive layers extends along the barrier layer and completely covers the corresponding first negative electrode and the corresponding ground contact.

3. The LED display according to claim 1, further comprising:
a first insulation layer, the first insulation layer is disposed on the first conductive structure;
a second adhesive layer, the second adhesive layer is disposed on the first insulation layer;
a plurality of second light-emitting assemblies, each of the second light-emitting assemblies including a plurality of second LED structures that are disposed on the second adhesive layer without contacting the first conductive structure, and each of the second LED structures having a second positive electrode and a second negative electrode;
a first spacer layer formed on the first insulation layer and the plurality of the second light-emitting assemblies; and
a second conductive structure including a plurality of second positive conductive layers and a plurality of second negative conductive layers, each of the second positive conductive layers being electrically connected between the corresponding second positive electrode and the corresponding conductive contact, and each of the second negative conductive layers being electrically connected between the corresponding second negative electrode and the corresponding ground contact.

4. The LED display according to claim 1, further comprising:
a second insulation layer disposed on the second conductive structure;
a third adhesive layer disposed on the second insulation layer;
a plurality of third light-emitting assemblies, each of the third light-emitting assemblies including a plurality of third LED structures that are disposed on the third adhesive layer without contacting the second conductive structure, and each of the third LED structures having a third positive electrode and a third negative electrode;
a second spacer layer formed on the second insulation layer and the plurality of the third light-emitting assemblies; and
a first conductive structure including a plurality of first positive conductive layers and a plurality of first negative conductive layers, each of the first positive conductive layers being electrically connected between the corresponding third positive electrode and the corresponding conductive contact, and each of the third negative conductive layers being electrically connected between the corresponding third negative electrode and the corresponding ground contact.

5. The LED display according to claim 4, wherein the first light-emitting assembly, the second light-emitting assembly, and the third light-emitting assembly are sequentially stacked, and the plurality of the first LED structures respectively correspond to the plurality of the second LED structures; each of the second LED structures respectively corresponds to a plurality of the third LED structures, each of the second LED structures respectively corresponds to a plurality of the third LED structures, and each of the first LED structures, the corresponding second LED structure, and the corresponding third LED structure are sequentially stacked to form a pixel.

6. An LED display, comprising:
a wafer-level substrate including a plurality of control circuits, each of the control circuits having a conductive contact;
a first adhesive layer disposed on the wafer-level substrate;
a plurality of first light-emitting assemblies, each of the first light-emitting assemblies including a plurality of first LED structures disposed on the first adhesive layer;
a barrier layer formed on the wafer-level substrate and the plurality of first light-emitting assemblies; and
a first conductive structure electrically connected between the first LED structure and the control circuit that correspond to each other;
wherein the control circuits are respectively separate from the first LED structures by the first adhesive layer and the barrier layer.

7. The LED display according to claim 6, wherein the wafer-level substrate is one of a Polished Silicon Wafer, an Epitaxial Silicon Wafer, an Argon Anneal Silicon Wafer, a Hai Silicon Wafer and a Silicon on Insulator Silicon Wafer, and the control circuit is a CMOS control circuit; wherein the first adhesive layer has the same or approximately the same thermal expansion coefficient as the wafer-level substrate, and the first adhesive layer is one of a Polyetheretherketone first adhesive layer, a Benzocyclobutene first adhesive layer and a Hydrogen Silsesquioxane first adhesive layer; wherein each of the first LED structures includes an n-type conductive layer, a light-emitting layer, and a p-type conductive layer; the n-type conductive layer is an n-type gallium nitride material layer, the light-emitting layer is a multi-quantum well structure layer, and the p-type conductive layer is a p-type gallium nitride material layer.

8. The LED display according to claim 6, further comprising:
a first insulation layer disposed on the first conductive structure;
a second adhesive layer disposed on the first insulation layer;
a plurality of second light-emitting assemblies, each of the second light-emitting assemblies including a plurality of second LED structures disposed on the second adhesive layer; and
a second conductive structure electrically connected between the second LED structure and the control circuit corresponding to each other.

9. The LED display according to claim 8, further comprising:
a second insulation layer disposed on the second conductive structure;
a third adhesive layer disposed on the second insulation layer;

a plurality of third light-emitting assemblies, each of the third light-emitting assemblies including a plurality of third LED structures disposed on the third adhesive layer; and a third conductive structure electrically connected between the third LED structure and the control circuit that correspond to each other.

10. The LED display according to claim 9, wherein the first light-emitting assembly, the second light-emitting assembly, and the third light-emitting assembly are sequentially stacked, and the plurality of the first LED structures respectively correspond to the plurality of the second LED structures; each of the second LED structures respectively corresponds to a plurality of the third LED structures, each of the second LED structures respectively corresponds to a plurality of the third LED structures, and each of the first LED structures, the corresponding second LED structure, and the corresponding third LED structure are sequentially stacked to form a pixel.

* * * * *